(12) United States Patent
Enkisch et al.

(10) Patent No.: US 10,520,827 B2
(45) Date of Patent: Dec. 31, 2019

(54) OPTICAL SYSTEM, IN PARTICULAR FOR A MICROLITHOGRAPHIC PROJECTION EXPOSURE APPARATUS

(71) Applicant: Carl Zeiss SMT GmbH, Oberkochen (DE)

(72) Inventors: Hartmut Enkisch, Aalen (DE); Thomas Schicketanz, Aalen (DE); Matus Kalisky, Aalen (DE); Oliver Dier, Lauchheim (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 0 days.

(21) Appl. No.: 16/241,462

(22) Filed: Jan. 7, 2019

(65) Prior Publication Data
US 2019/0212659 A1 Jul. 11, 2019

Related U.S. Application Data

(63) Continuation of application No. PCT/EP2017/063715, filed on Jun. 6, 2017.

(30) Foreign Application Priority Data

Jul. 7, 2016 (DE) .......................... 10 2016 212 373

(51) Int. Cl.
*G03B 27/54* (2006.01)
*G03F 7/20* (2006.01)

(52) U.S. Cl.
CPC .......... *G03F 7/70191* (2013.01); *G03F 7/702* (2013.01); *G03F 7/70308* (2013.01); *G03F 7/70316* (2013.01); *G03F 7/70958* (2013.01)

(58) Field of Classification Search
CPC ..... G21K 1/062; G03F 7/70191; G03F 7/702; G03F 7/70308; G03F 7/70316;
(Continued)

(56) References Cited

U.S. PATENT DOCUMENTS 5,268,951 A * 12/1993 Flamholz ................. G21K 1/06
378/34
6,333,961 B1 12/2001 Murakami
(Continued)

FOREIGN PATENT DOCUMENTS

DE 102006059024 A1 6/2008
DE 102008001511 A1 11/2009
(Continued)

OTHER PUBLICATIONS

GPTO Office Action, Application 10 2016 212 373.4 dated Feb. 14, 2017, with English translation, 16 pages.
(Continued)

*Primary Examiner* — Christina A Riddle
(74) *Attorney, Agent, or Firm* — Edell, Shapiro & Finnan, LLC

(57) ABSTRACT

An optical system, in particular for a microlithographic projection exposure apparatus, with at least one mirror (200) which has an optically effective surface and, for electromagnetic radiation of a predefined operating wavelength impinging on the optically effective surface at an angle of incidence of at least 65° relative to the respective surface normal, has a reflectivity of at least 0.5. The mirror has a reflection layer (210) and a compensation layer (220) which is arranged above this reflection layer (210) in the direction of the optically effective surface. The compensation layer (220), for an intensity distribution generated in a pupil plane or a field plane of the optical system during operation thereof, reduces the difference between the maximum and the minimum intensity value by at least 20% compared to an analogous structure without the compensation layer.

21 Claims, 11 Drawing Sheets

(58) Field of Classification Search
CPC ............. G03F 7/70958; G03F 7/70033; G03F 7/70075; G03F 7/7015; G03F 7/70166; G03F 7/70233; G03F 7/70908; G03F 7/70941; G03F 7/7095
USPC ............. 355/50–54, 55, 60, 66–71, 77; 250/492.1, 492.2, 492.22, 493.1, 503.1, 250/504 R, 505.1; 359/350, 351, 359/359–361
See application file for complete search history.

(56) References Cited

U.S. PATENT DOCUMENTS

| | | |
|---|---|---|
| 6,833,223 B2 | 12/2004 | Shiraishi |
| 6,927,901 B2 | 8/2005 | Mann et al. |
| 8,279,404 B2 | 10/2012 | Chan et al. |
| 8,587,767 B2 | 11/2013 | Fiolka et al. |
| 8,605,257 B2 | 12/2013 | Schreible et al. |
| 8,928,972 B2 | 1/2015 | Weber |
| 9,013,678 B2 | 4/2015 | Chan et al. |
| 9,341,958 B2 | 5/2016 | Enkisch et al. |
| 2006/0072090 A1* | 4/2006 | Bakker ............... G03F 7/70191 355/53 |
| 2007/0287076 A1 | 12/2007 | Masaki et al. |
| 2009/0251677 A1 | 10/2009 | Endres et al. |
| 2013/0038929 A1* | 2/2013 | Muellender ............ G02B 1/105 359/359 |
| 2014/0022525 A1 | 1/2014 | Enkisch et al. |
| 2014/0368801 A1* | 12/2014 | Rostalski ........... G02B 17/0663 355/66 |
| 2015/0316851 A1* | 11/2015 | Wabra .................. G02B 5/0816 359/359 |

FOREIGN PATENT DOCUMENTS

| | | |
|---|---|---|
| DE | 102009054653 A1 | 6/2011 |
| DE | 102011075579 A1 | 11/2012 |
| DE | 102012202675 A1 | 1/2013 |
| DE | 102014204660 A1 | 9/2015 |
| DE | 102016207487 A1 | 7/2016 |
| EP | 1282011 B1 | 2/2003 |
| EP | 2191332 B2 | 6/2010 |
| EP | 2100190 B2 | 4/2012 |
| NL | 2006647 A1 | 6/2011 |
| WO | 2012113591 A1 | 8/2012 |
| WO | 2015135726 A1 | 9/2015 |

OTHER PUBLICATIONS

International Search Report and the Written Opinion, PCT/EP2017/0637, dated Oct. 13, 2017, 2 pages.
PCT International Preliminary Report on Patentability, PCT/EP2017/063715, dated Jan. 8, 2019, 10 pages.

* cited by examiner

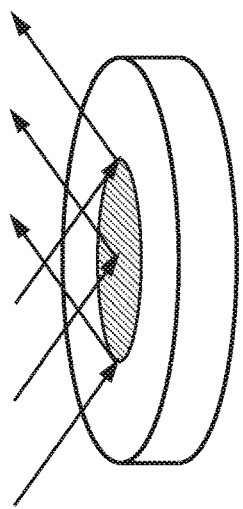
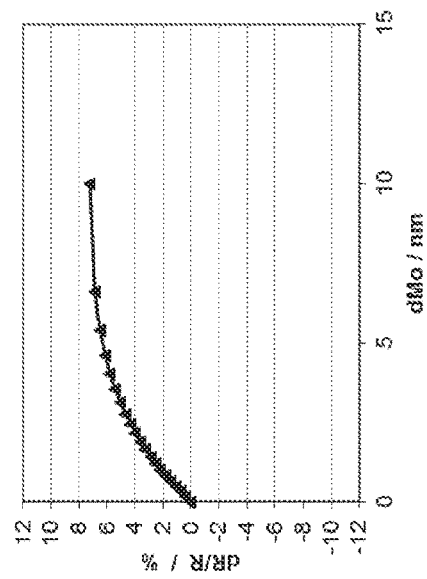
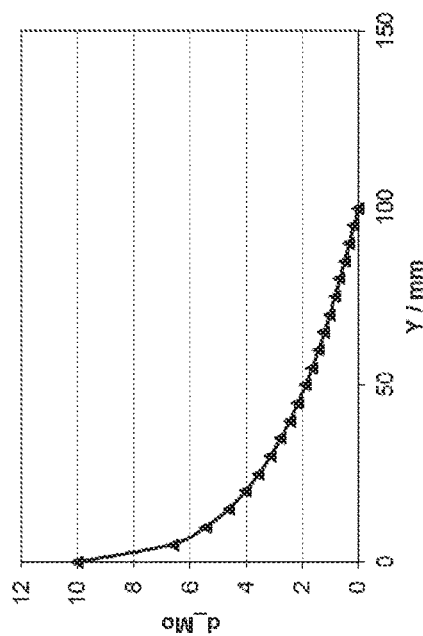
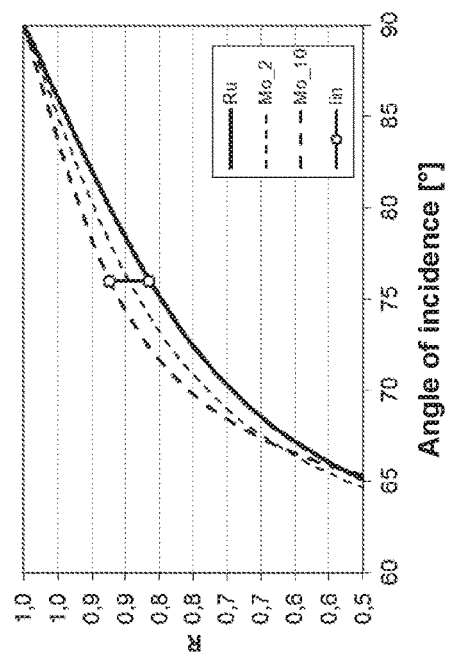
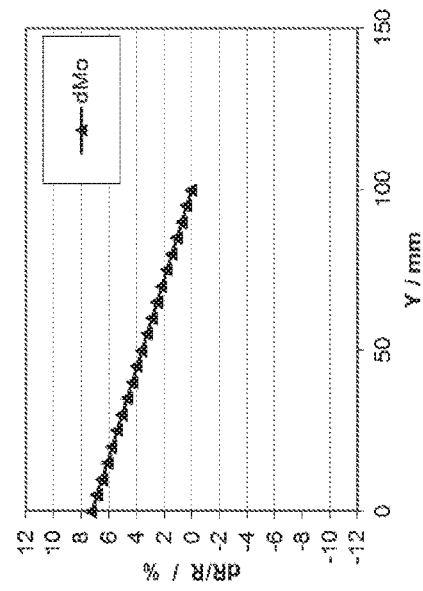
Fig. 9A
Fig. 9B
Fig. 9C
Fig. 9D
Fig. 9E

OPTICAL SYSTEM, IN PARTICULAR FOR A MICROLITHOGRAPHIC PROJECTION EXPOSURE APPARATUS

CROSS REFERENCE TO RELATED APPLICATIONS

This is a Continuation of International Application PCT/EP2017/063715, which has an international filing date of Jun. 6, 2017, and the disclosure of which is incorporated in its entirety into the present Continuation by reference. This Continuation also claims foreign priority under 35 U.S.C. § 119(a)-(d) to, and also incorporates by reference, in its entirety, German Patent Application DE 10 2016 212 373.4 filed on Jul. 7, 2016.

FIELD OF THE INVENTION

The invention relates to an optical system, in particular for a microlithographic projection exposure apparatus.

BACKGROUND

Microlithography is used for producing microstructured components such as, for example, integrated circuits or LCDs. The microlithography process is carried out in what is called a projection exposure apparatus, which comprises an illumination device and a projection lens. The image of a mask (reticle) illuminated by the illumination device is in this case projected by the projection lens onto a substrate (e.g. a silicon wafer) coated with a light-sensitive layer (photoresist) and arranged in the image plane of the projection lens, in order to transfer the mask structure to the light-sensitive coating of the substrate.

In projection lenses designed for the EUV range, i.e. at wavelengths of e.g. approximately 13 nm or approximately 7 nm, owing to the lack of availability of suitable light-transmissive refractive materials, mirrors are used as optical components for the imaging process.

Among others, the operation of mirrors under grazing incidence is known. Such mirrors operated under grazing incidence, which it is desirable to use chiefly in respect of the comparatively high obtainable reflectivities (e.g. of 80% and more), are understood here and in the following to mean mirrors for which the reflection angles, which occur during the reflection of the EUV radiation and relate to the respective surface normal, are at least 65°. Sometimes, such mirrors are also referred to in an abbreviated fashion as GI mirrors ("grazing incidence").

A problem arising in practice in the operation of a microlithographic projection exposure apparatus is, among other things, that undesired local variations of the intensity in the field plane and/or pupil plane occur which result in optical aberrations and therefore in a deterioration of the efficiency of the projection exposure apparatus. One of the causes of this undesired intensity variation lies in the variations of the reflectivity across the respective mirror, which variations are comparatively strong in particular in the aforementioned mirrors operated under grazing incidence and in turn are caused by significant variations of the angle of incidence across the optically effective surface of the respective mirror.

To overcome the problem described above, various approaches are known in practice by which the said intensity variations are compensated. Examples of these approaches are the deliberate detuning of the reflection layer system in the mirrors operated with substantially perpendicular incidence, or the deliberate provision, by other means, of a lateral transmission variation, e.g. by use of additional layers.

However, disadvantages arising in practice in such approaches generally include loss of light and an increased sensitivity to manufacturing fluctuation, and also a greater complexity of the process of producing the relevant mirrors used for correction. Moreover, in the case where the described intensity variation is caused by a GI mirror, the profile of the reflectivity of the respective GI mirror, which is dependent on the angle of incidence, is itself subject to manufacturing fluctuations, which in turn necessitate repeated adaptation of the respective correction in each individual case.

With regard to the prior art, reference is simply made to EP 1 282 011 B1, U.S. Pat. No. 6,333,961 B1, U.S. Pat. No. 6,833,223 B2, WO 2015/135726 A1, WO 2012/113591 A1, U.S. Pat. No. 8,279,404 B2, U.S. Pat. No. 8,605,257 B2, U.S. Pat. No. 8,587,767 B2, EP 2 100 190 B1, U.S. Pat. No. 8,928,972 B2 and US 2013/0038929 A1.

SUMMARY

Against this background, it is an object of the present invention to make available an optical system, in particular for a microlithographic projection exposure apparatus, in which undesired intensity variations, and the resulting deterioration in efficiency of the optical system, can be reduced with comparatively little effort.

This object, inter alia, is achieved by way of the features recited in the formulations set forth in the independent claims below.

An optical system, in particular for a microlithographic projection exposure apparatus, has at least one mirror which has an optically effective surface and, for electromagnetic radiation of a predefined operating wavelength impinging on the optically effective surface at an angle of incidence of at least 65° relative to the respective surface normal, has a reflectivity of at least 0.5, wherein the mirror has a reflection layer and a compensation layer which is arranged above this reflection layer in the direction of the optically effective surface;

wherein the compensation layer, for an intensity distribution generated in a pupil plane or a field plane of the optical system during operation thereof, reduces the difference between the maximum and the minimum intensity value by at least 20% compared to an analogous structure without the compensation layer.

One concept associated with the invention is in particular that an undesired local variation of the intensity of the electromagnetic radiation at the site of a mirror operated under grazing incidence (GI) can be compensated by virtue of the fact that an additional compensation layer is provided on the reflection layer (typically configured as a single layer, e.g. of ruthenium) of the GI mirror in question, the function of which compensation layer is to at least partially compensate said variation of the intensity distribution.

The additional application, according to the invention, of said compensation layer to a GI mirror is relatively simple in terms of manufacturing technology, since in the simplest case only one further layer has to be applied to a reflection layer configured as a single layer, instead of a comparatively complex modification of a multi-layer system, as in the case of a NI mirror. Moreover, in the concept according to the invention, the "lateral separation" of the angles of incidence across the optically effective surface of the respective GI mirror can be specifically utilized in order to influence different angles of incidence in different ways via the corresponding configuration of the compensation layer and in particular its lateral modification, as is described in more detail below.

The undesired intensity variation to be compensated according to the present invention can be, on the one hand, an intensity variation which is brought about by the reflection layer of the GI mirror itself or by its reflection variation in the lateral direction across the optically effective surface, such that in other words the GI mirror in question can be compensated, by the added compensation layer according to the invention, in terms of the described effect of the intensity variation "per se".

On the other hand, however, the intensity variation to be compensated can also involve a compensation effected by one or more disturbances present elsewhere in the optical system, such that in this case the GI mirror provided with the compensation layer according to the invention is used as a correction element for homogenizing an intensity distribution present elsewhere in the system (e.g. the intensity distribution in a field plane or pupil plane).

In embodiments, at least one further layer (e.g. a capping layer) can be provided on the compensation layer according to the invention.

According to one embodiment, the compensation layer has one or more elements from the group containing molybdenum (Mo), niobium (Nb), zirconium (Zr), yttrium (Y), cerium (Ce), lanthanum (La), calcium (Ca), barium (Ba), strontium (Sr), titanium (Ti), beryllium (Be), boron (B), carbon (C), nitrogen (N), oxygen (O), silicon (Si) and fluorine (F).

According to one embodiment, the compensation layer has a varying thickness. In this respect, the invention involves the concept of making deliberate use of the thickness dependency of the reflectivity of a compensation layer according to the invention, in connection with the above-described lateral separation of the angles of incidence occurring on the GI mirror in question, in order by deliberate detuning of the layer thickness of the compensation layer, and the associated modification of the reflectivity thereof, to achieve the desired compensation effect with regard to the undesired intensity variation.

According to one embodiment, the reflection layer has a first material and the compensation layer has a second material, wherein the second material in the layer stack composed of reflection layer and compensation layer has, by comparison with the first material, a higher reflectance for electromagnetic radiation of a predefined operating wavelength impinging on the optically effective surface at an angle of incidence of at least 65° relative to the respective surface normal.

According to one embodiment, the reflection layer has a first material and the compensation layer has a second material, wherein the second material in the layer stack composed of reflection layer and compensation layer has, by comparison with the first material, a lower reflectance for electromagnetic radiation of a predefined operating wavelength impinging on the optically effective surface at an angle of incidence of at least 65° relative to the respective surface normal.

According to one embodiment, the reflection layer has one or more elements from the group containing ruthenium (Ru), rhodium (Rh) and palladium (Pd).

According to one embodiment, the compensation layer has one or more elements from the group containing molybdenum (Mo), niobium (Nb), zirconium (Zr), yttrium (Y), cerium (Ce), lanthanum (La), calcium (Ca), barium (Ba), strontium (Sr), titanium (Ti), beryllium (Be), boron (B), carbon (C), nitrogen (N), oxygen (O), silicon (Si) and fluorine (F).

Thus, depending on the specific configuration, the compensation layer according to the invention can effect an increase of also a decrease in the reflectivity of the respective GI mirror relative to an analogous structure without the compensation layer in question (e.g. a mirror having only a single reflection layer, for example of ruthenium (Ru)). The approach involving use of a layer causing a decrease of the reflectivity of the respective GI mirror is based on the consideration that the aim according to the invention, of homogenizing the intensity distribution in a pupil plane or field plane, can also be achieved by deliberate lateral reduction of the reflectivity (admittedly then at the expense of the overall level of reflectivity obtained).

An additional layer that increases the reflectivity of the GI mirror compared to the (single) reflection layer is also designated below as an "amplifier layer", and a layer that decreases the reflectivity is also designated as an "attenuator layer".

An amplifier layer in the sense defined above can in particular be produced from a material that has a lower absorption than the material of the reflection layer (still with an acceptable refractive index). The material of the amplifier layer can be, for example, molybdenum (Mo), niobium (Nb), zirconium (Zr) or a compound of one or more of these elements with one or more elements of the second period (e.g. beryllium (Be), boron (B), carbon (C), nitrogen (N)) or silicon (Si). For illustrative embodiments, reference is made to DE 10 2014 204 660 A1.

An attenuator layer in the sense of the above definition can be produced, for example, from molybdenum dioxide ($MoO_2$), titanium dioxide ($TiO_2$), yttrium oxide ($Y_2O_3$), niobium oxide ($Nb_2O_5$), zirconium oxide ($ZrO_2$) or cerium oxide ($CeO_2$). Other suitable materials are, for example, noble or no longer oxidizing absorbent metals, e.g. palladium (Pd), rhodium (Rh), platinum (Pt) or iridium (Ir), or compounds.

In further embodiments, the compensation layer according to the invention can also be configured, by suitable combination of an amplifier layer and of an attenuator layer, in such a way that the reflectivity of the mirror in question is increased over a first lateral sub-region (as a result of an amplifier layer present there) and is reduced over a second lateral sub-region (as a result of an attenuator layer present there). In this way, as will be described in more detail below, it may also be possible to further increase the correction potential or increase the range of angle of incidence in which the homogenization, according to the invention, of the intensity variation is obtained.

According to one embodiment, a substrate protection layer is formed between the substrate and the reflection layer and protects the substrate from destructive action of the electromagnetic radiation.

According to one embodiment, the substrate protection layer has one or more materials from the group containing iron (Fe), nickel (Ni), cobalt (Co), chromium (Cr), vanadium (V), copper (Cu), silver (Ag), gold (Au), platinum (Pt), iridium (Ir), ruthenium (Ru), palladium (Pd), rhodium (Rh), germanium (Ge), tungsten (Wo), molybdenum (Mo), tin (Sn), zinc (Zn), indium (In) and tellurium (Te).

According to one embodiment, a layer that reduces layer stress is formed between the substrate and the reflection layer.

According to one embodiment, the substrate protection layer is configured as a layer that reduces layer stress.

According to one embodiment, the layer that reduces layer stress has one or more materials from the group containing iron (Fe), nickel (Ni), cobalt (Co), chromium (Cr), vanadium (V), copper (Cu), silver (Ag), gold (Au), platinum (Pt), iridium (Ir), ruthenium (Ru), palladium (Pd), rhodium (Rh), germanium (Ge), tungsten (Wo), molybdenum (Mo), tin (Sn), zinc (Zn), indium (In) and tellurium (Te).

According to one embodiment, at least one of the aforementioned layers (i.e. the reflection layer, the compensation layer, the substrate protection layer and/or the layer that reduces layer stress) is configured as a multi-layer system.

According to one embodiment, the operating wavelength is less than 30 nm, and it can in particular lie in the range of 10 nm to 15 nm.

The invention further relates to a mirror, in particular for a microlithographic projection exposure apparatus, wherein the mirror has an optically effective surface and has a reflectivity of at least 0.5 for electromagnetic radiation of a predefined operating wavelength impinging on the optically effective surface at an angle of incidence of at least 65° relative to the respective surface normal, wherein the mirror has a reflection layer and a compensation layer which is arranged above this reflection layer in the direction of the optically effective surface; and wherein the compensation layer, for the local variation of the reflectivity of the mirror across the optically effective surface, reduces the difference between the maximum and the minimum value by at least 20% compared to an analogous structure without the compensation layer.

The mirror according to the invention can be arranged in the illumination device or else in the projection lens.

The invention further relates to a microlithographic projection exposure apparatus, comprising an illumination device and a projection lens, wherein the illumination device, during the operation of the projection exposure apparatus, illuminates a mask situated in an object plane of the projection lens, and the projection lens images structures on said mask onto a light-sensitive layer situated in an image plane of the projection lens, wherein the projection exposure apparatus comprises an optical system or a mirror having the features described above.

Further configurations associated with aspects of the invention can be gathered from the description and the dependent claims below.

The invention is explained in greater detail below on the basis of exemplary embodiments illustrated in the accompanying figures.

BRIEF DESCRIPTION OF THE DRAWINGS

FIG. 9A shows the structure of an illustrative embodiment proceeding from a constant angle of incidence, with FIG. 9B showing a profile for this embodiment of angle of incidence versus reflectivity, FIG. 9C showing a profile for this embodiment of amplifier layer thickness versus reflectivity variation, and FIGS. 9D and 9E showing profiles of overall thickness versus reflectivity variation and amplifier layer thickness, respectively;

DETAILED DESCRIPTION

Figure 1:
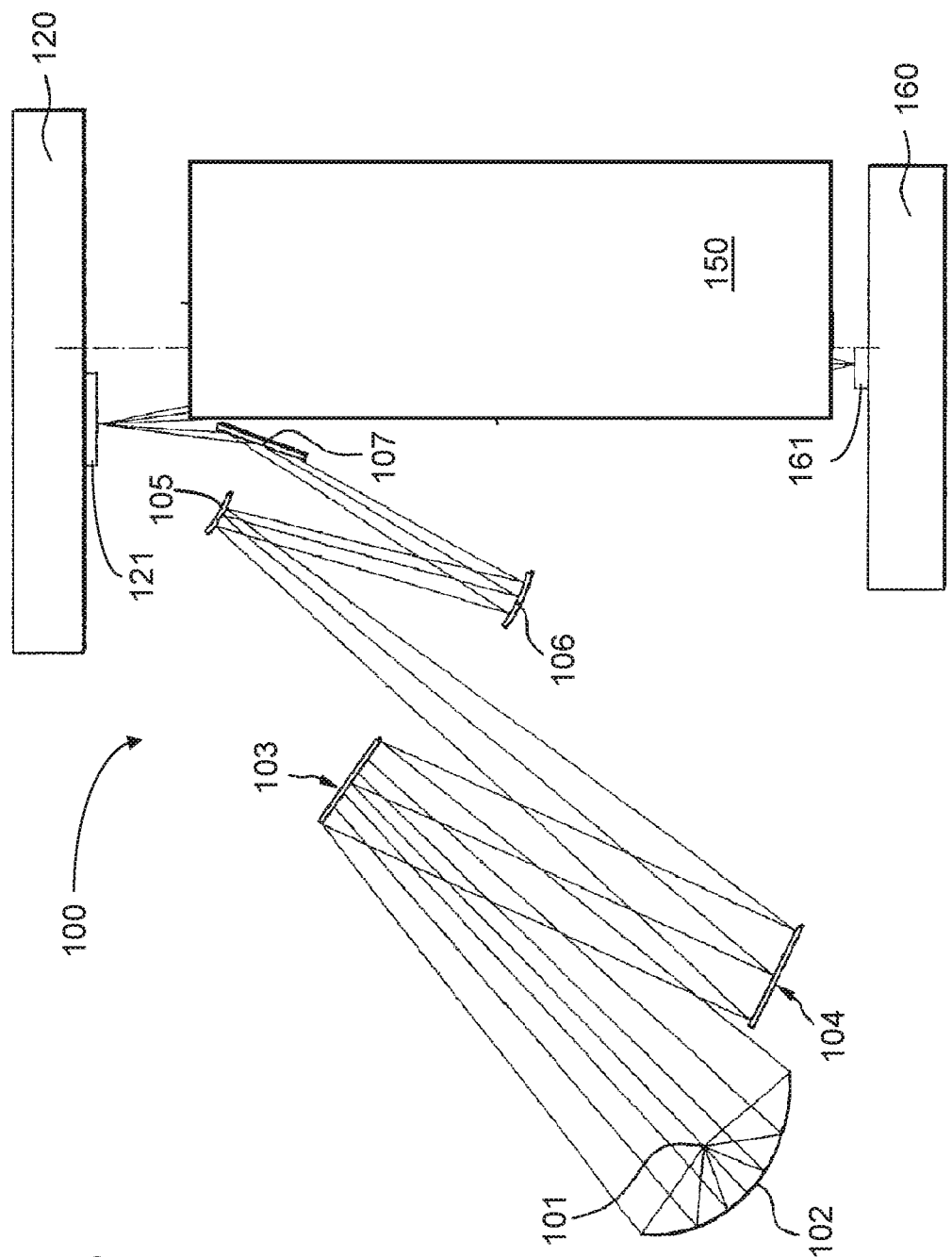
FIG. 1 shows a schematic view of a projection exposure apparatus designed for operation in EUV.

FIG. 1 shows a schematic view of one example of a projection exposure apparatus which is designed for operation in EUV and in which the present invention may be realized.

According to FIG. 1, an illumination device in a projection exposure apparatus 100 designed for EUV comprises a field facet mirror 103 and a pupil facet mirror 104. The light from a light source unit comprising a plasma light source 101 and a collector mirror 102 is directed onto the field facet mirror 103. A first telescope mirror 105 and a second telescope mirror 106 are arranged in the light path downstream of the pupil facet mirror 104. A deflection mirror 107 operated with grazing incidence is arranged downstream in the light path and directs the radiation impinging on it onto an object field in the object plane of a projection lens, which is merely indicated in FIG. 1. At the location of the object field, a reflective structure-bearing mask 121 is arranged on a mask stage 120, said mask being imaged with the aid of the projection lens into an image plane in which a substrate 161 coated with a light-sensitive layer (photoresist) is situated on a wafer stage 160.

Merely by way of example, the deflection mirror 107 operated with grazing incidence can have the structure according to the invention as described below with reference to FIG. 2 onwards. The projection lens 150 can have a structure as disclosed for example in DE 10 2012 202 675 A1 (this structure likewise having mirrors which are operated with grazing incidence and which can be configured according to the invention) or another structure.

Figure 2:
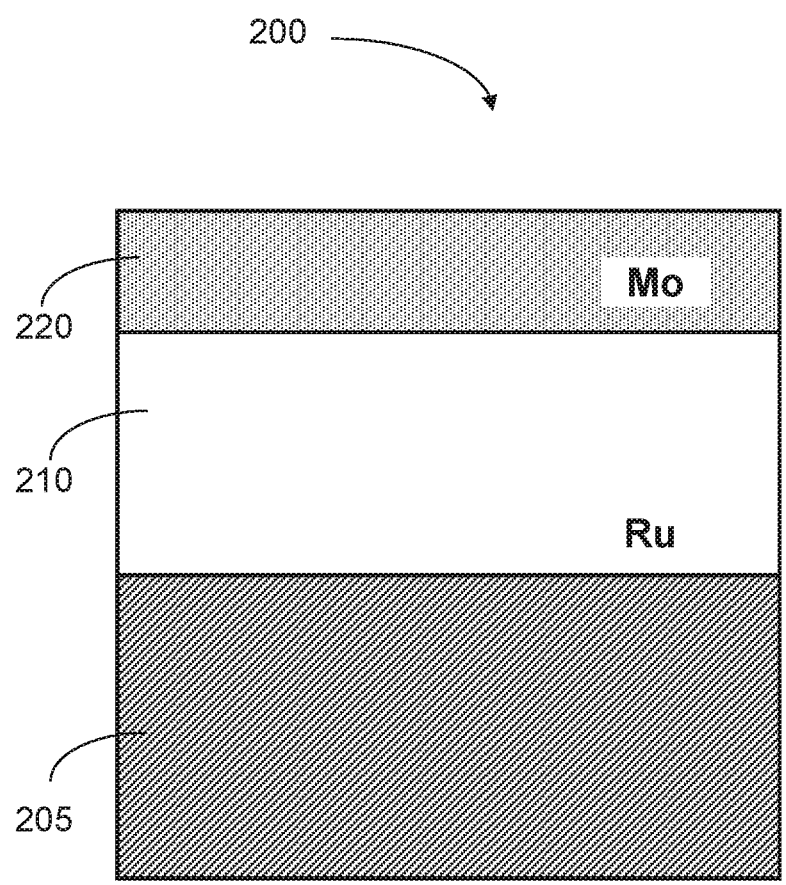
FIG. 2 shows a schematic view for explaining a possible structure of a mirror according to an illustrative embodiment of the invention.

FIG. 2 firstly shows a purely schematic and much simplified view of a possible structure of a mirror according to the invention in one embodiment. This mirror 200 is configured for operation with grazing incidence (i.e. as a "GI mirror") and has a reflection layer 210, composed of ruthenium (Ru) in the illustrative embodiment, on a substrate 205 made of any suitable substrate material (e.g. ULE® or Zerodur®). Located on this reflection layer 210 there is a compensation layer 220 according to the invention, which has a varying thickness and whose function is to at least partially compensate an undesired variation of the intensity distribution which the electromagnetic radiation reflected on the mirror 200 has (possibly also elsewhere in the optical system comprising the mirror 200).

This compensation layer 220 according to FIG. 2, serving as a so-called "amplifier layer", is produced from a material that has lower absorption compared to the material of the reflection layer 210 (i.e. compared to ruthenium (Ru) in the example). In the illustrative embodiment, the compensation layer 220 is composed of molybdenum (Mo). As will be explained in more detail below, the compensation layer in further embodiments can also be configured as a so-called "attenuator layer", which reduces the reflectivity of the mirror 200 compared to the (single) reflection layer.

Figure 3:
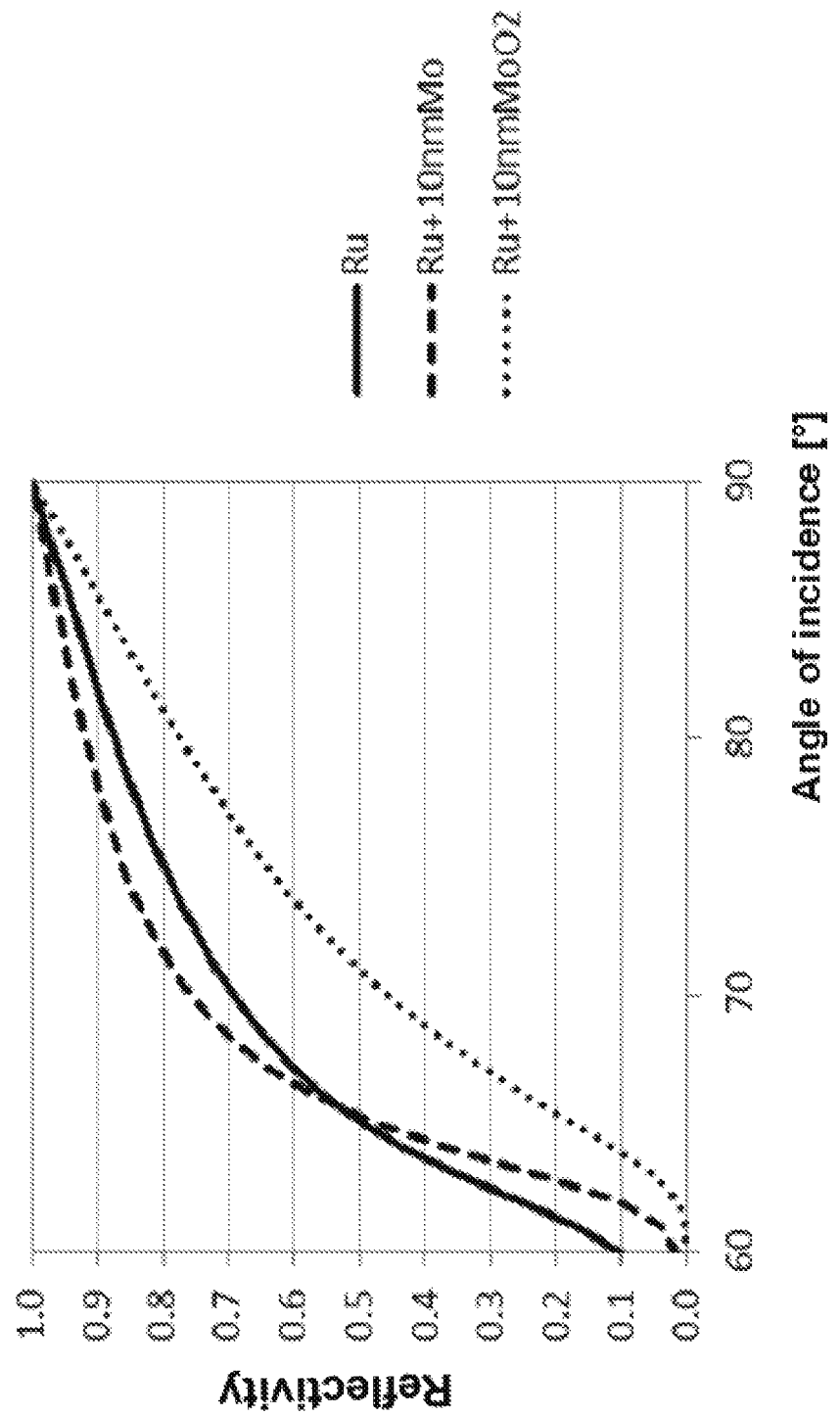
FIG. 3 shows, for explaining the action of a mirror according to the invention, an angle-of-incidence versus reflectivity profile.

To provide a basic explanation of the action of an "amplifier layer" or "attenuator layer", FIG. 3 shows a diagram in which the profile of the reflectivity, as a function of the respective angle of incidence of the electromagnetic radiation, is shown both for a mirror with an amplifier layer (in the example 10 nm molybdenum (Mo)), with an attenuator layer (in the example 10 nm molybdenum dioxide ($MoO_2$)), and also for an analogous mirror without amplifier layer or attenuator layer (i.e. only with the single layer of ruthenium (Ru)). It will be seen from FIG. 3 that the profile of the reflectivity across the angle of incidence can be significantly modified by addition of an amplifier layer and/or of an attenuator layer in the sense of the above definition.

With reference to FIG. 4 to FIG. 11, various embodiments are now explained in which a desired reflectivity profile across the mirror in question is set in each case by specific configuration of a compensation layer according to the invention which has an amplifier layer and/or attenuator layer with a specifically configured thickness profile.

Figure 4A:
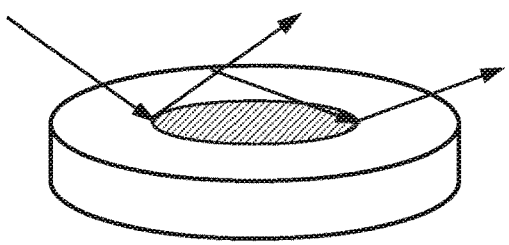
FIG. 4A shows the structure of an illustrative embodiment with an amplifier layer, with FIGS. 4B, 4C and 4D showing profiles for this embodiment of angle of incidence versus reflectivity, reflectivity variation and thickness, respectively.
Figure 4B:
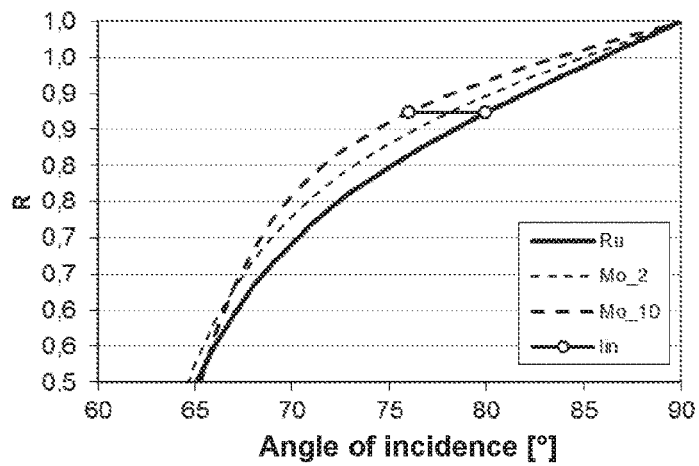

FIGS. 4A and 4B first of all show an illustrative embodiment in which the compensation layer (indicated by hatching in FIG. 4A) is configured as an amplifier layer of molybdenum (Mo), and in which a variation (likewise indicated in FIG. 4A) of the angle of incidence across the optically effective surface of the mirror is given for the electromagnetic radiation impinging on the mirror.

Figure 4C:
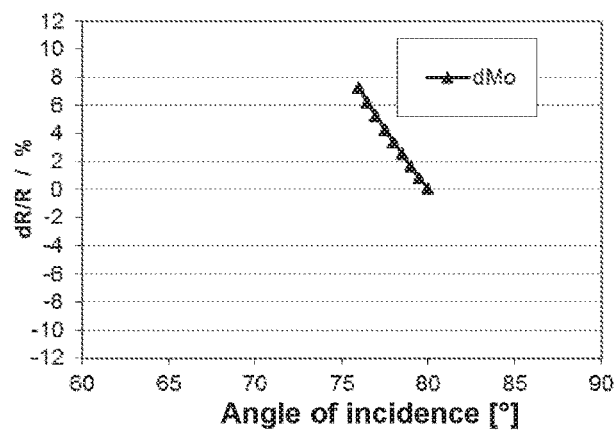
Figure 4D:
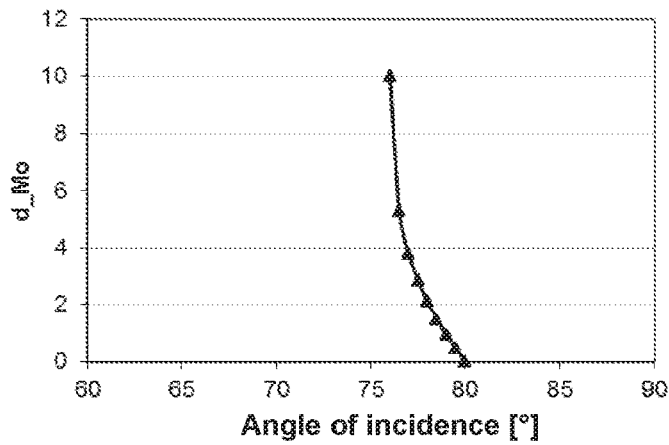

In this illustrative embodiment according to FIG. 4B, for each occurring angle of incidence or the associated location on the mirror, the thickness of the compensation layer is chosen such that the finally resulting reflectivity of the mirror has the desired (in the present example constant) value. FIG. 4C accordingly shows, as a function of the value of the angle of incidence, the reflectivity variation achieved with the amplifier layer of molybdenum (Mo), and FIG. 4D shows the thickness that this amplifier layer needs to have in order to achieve the desired (in the example constant) reflectivity profile across the angle of incidence.

In a manner analogous to the embodiment of FIG. 4A-4D, an attenuator layer (e.g. of molybdenum dioxide ($MoO_2$)) can also be used instead of an amplifier layer (e.g. of molybdenum (Mo)) in order to specifically set a desired reflectivity profile across the respective mirror. In particular, a homogenization of the reflectivity (i.e. the setting of a constant reflectivity profile) across the optically effective surface of the mirror is likewise possible here, wherein, on account of the reduction of the reflectivity effected by the attenuator layer compared to a mirror having only the reflection layer (e.g. of ruthenium (Ru)), this homogenization takes place at a comparatively lower level (determined by the reflectivity of the reflection layer itself).

Figure 5A:
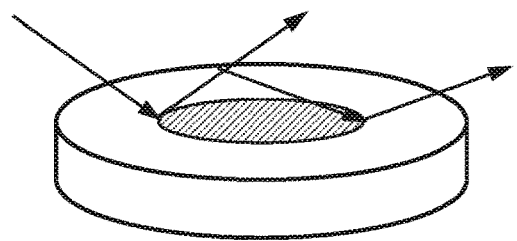
FIG. 5A shows the structure of an illustrative embodiment with an attenuation layer, with FIGS. 5B, 5C and 5D showing profiles for this embodiment of angle of incidence versus reflectivity, reflectivity variation and thickness, respectively.
Figure 5B:
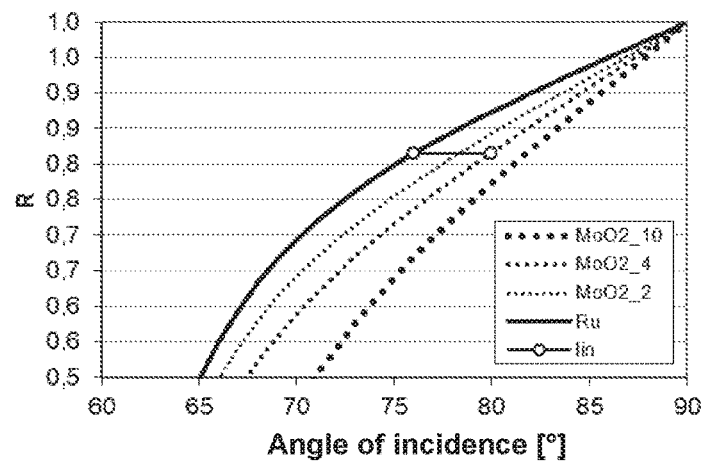
Figure 5C:
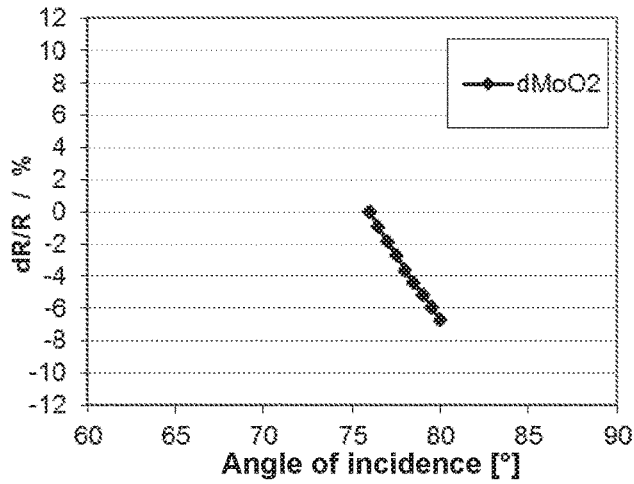
Figure 5D:
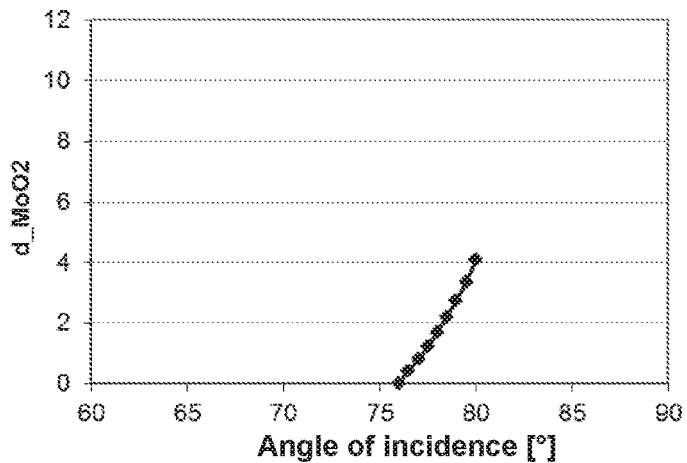

In this connection, FIGS. 5A-5D show diagrams analogous to FIGS. 4A-4D in order to explain the configuration and mode of action of such an attenuator layer. As will be seen from FIG. 5B, the thickness of the attenuator layer is again suitably chosen as a function of the respective value of the angle of incidence in order to achieve the desired (in this example also constant) reflectivity value, wherein FIG. 5C shows, as a function of the angle of incidence, the reflectivity change on account of the attenuator layer, and FIG. 5D shows the respectively required thickness of the attenuator layer as a function of the angle of incidence.

Figure 6A:
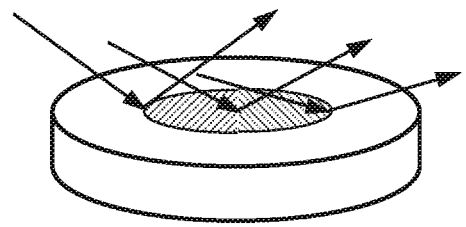
FIG. 6A shows the structure of an illustrative embodiment with an amplifier layer and an attenuation layer, with FIGS. 6B, 6C and 6D showing profiles for this embodiment of angle of incidence versus reflectivity, reflectivity variation and thickness, respectively.
Figure 6B:
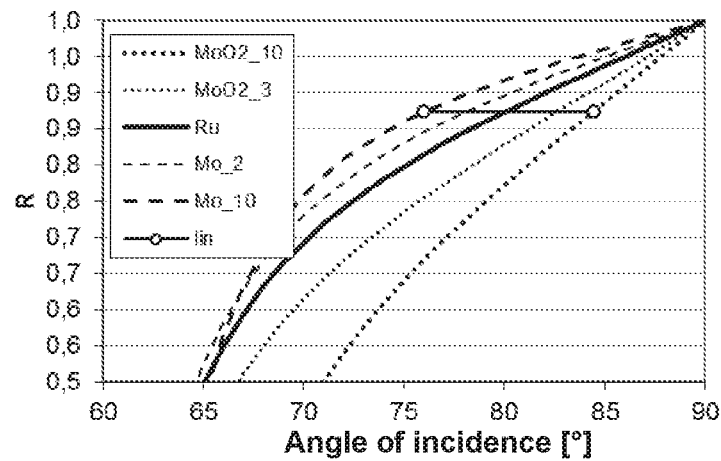

In a further illustrative embodiment according to FIGS. 6A-6D, an amplifier layer and an attenuator layer can be used in combination on one and the same mirror (each in different areas of the optically effective surface), as is indicated purely schematically in FIG. 6A by different hatching of the entire compensation layer. In a manner analogous in principle to FIGS. 4A-4D and FIGS. 5A-5D, but overall across a wider spectrum of angles of incidence, a homogenization of the reflectivity can in this way be achieved across the optically effective surface of the mirror. As will be seen from FIG. 6B, the attenuator layer (e.g. of molybdenum dioxide ($MoO_2$)) is in this case located only in areas on the mirror with a comparatively high angle of incidence, whereas the amplifier layer (e.g. of molybdenum (Mo)) is located only in areas on the mirror with a comparatively lower angle of incidence.

Figure 6C:
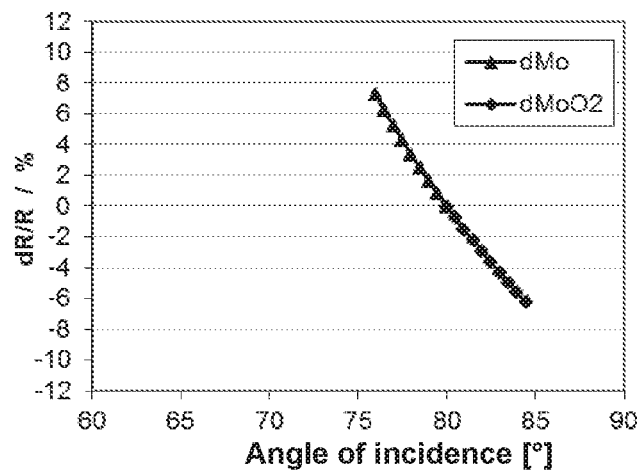
Figure 6D:
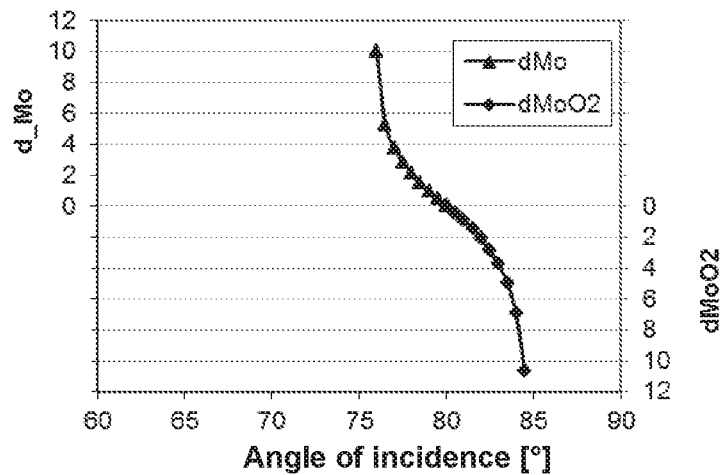
Figure 7A:
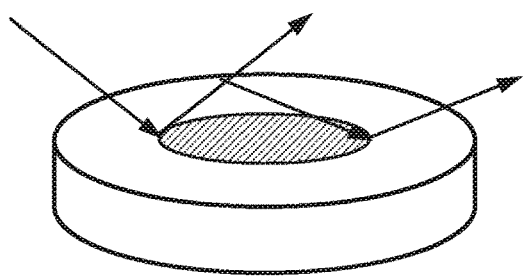
FIG. 7A shows the structure of an illustrative embodiment for generating a linear profile, with FIGS. 7B, 7C and 7D showing profiles for this embodiment of angle of incidence versus reflectivity, reflectivity variation and thickness, respectively.
Figure 7B:
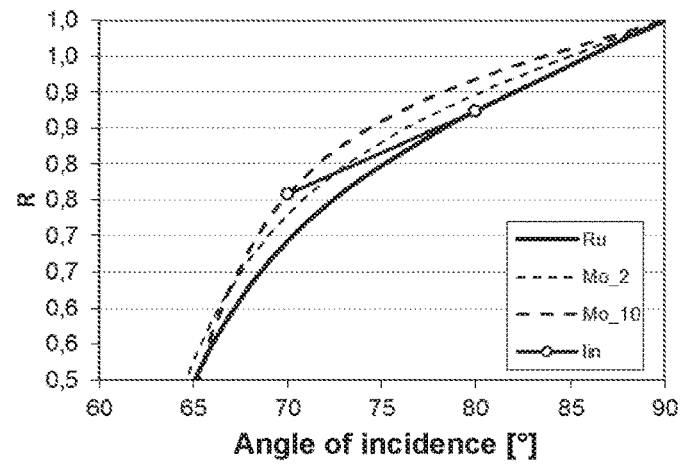
Figure 7C:
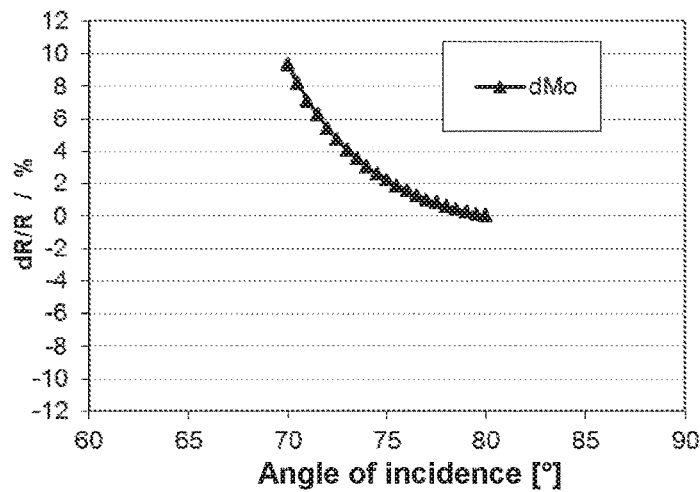
Figure 7D:
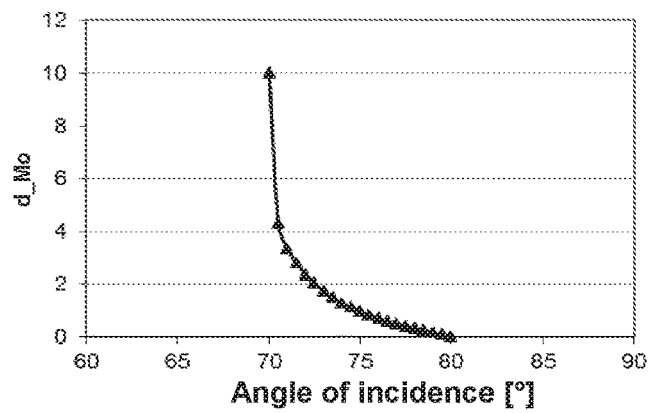
Figure 8A:
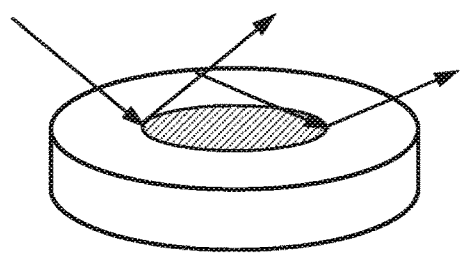
FIG. 8A shows the structure of an illustrative embodiment for generating a sinusoidal profile, with FIGS. 8B, 8C and 8D showing profiles for this embodiment of angle of incidence versus reflectivity, reflectivity variation and thickness, respectively.
Figure 8B:
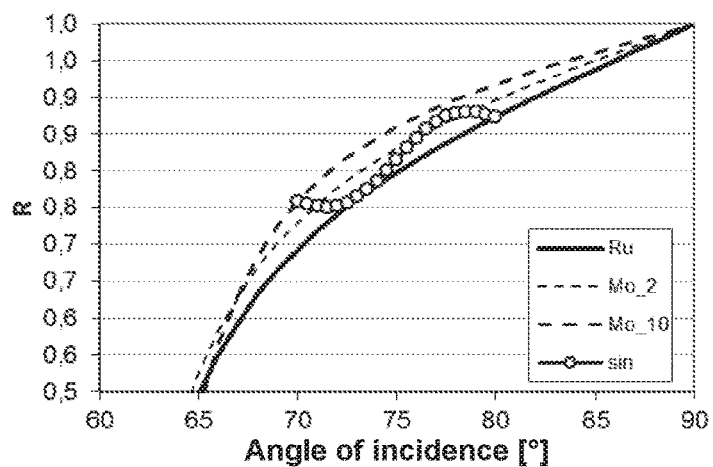
Figure 8C:
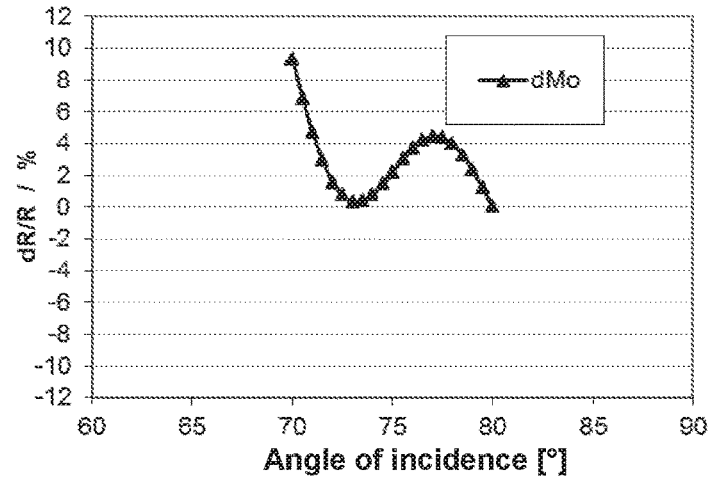
Figure 8D:
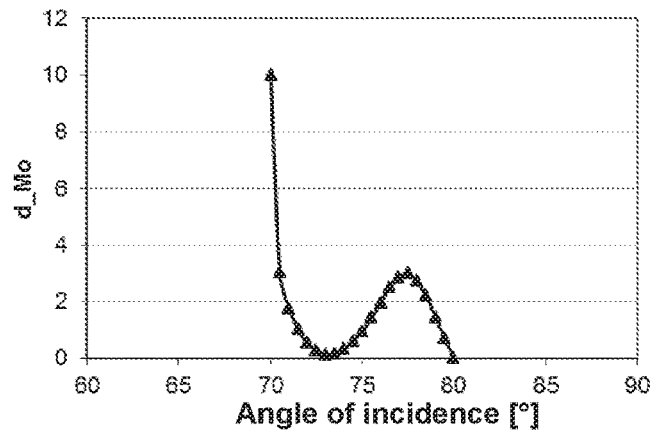

FIG. 6C, analogous to FIGS. 4C and 5C, described above, shows, as a function of the angle of incidence, the required reflectivity change, and FIG. 6D shows the thickness required by the amplifier layer or attenuator layer for the respective angle of incidence.

The invention is not limited to the homogenization of the reflectivity profile as effected in the above-described embodiments in FIGS. 4 to 6, and therefore any other desired profiles of the reflectivity can also be set. For this purpose, FIGS. 7A-7D show in an otherwise analogous manner an illustrative embodiment for generating a linear profile of the reflectivity across the angle of incidence and the corresponding location on the mirror, and FIGS. 8A-8D show an illustrative embodiment for a substantially sinusoidal profile of the reflectivity.

Although a variation of the angle of incidence across the optically effective surface of the mirror has been assumed in the embodiments described above with reference to FIGS. 4 to 8, the invention is not limited to this. Instead, the invention can also be used without the presence of such a variation of the angle of incidence in order to set a desired reflectivity profile, e.g. in order to homogenize an undesired variation of the intensity present elsewhere in the optical system (e.g. in a field plane or a pupil plane).

Figure 10A:
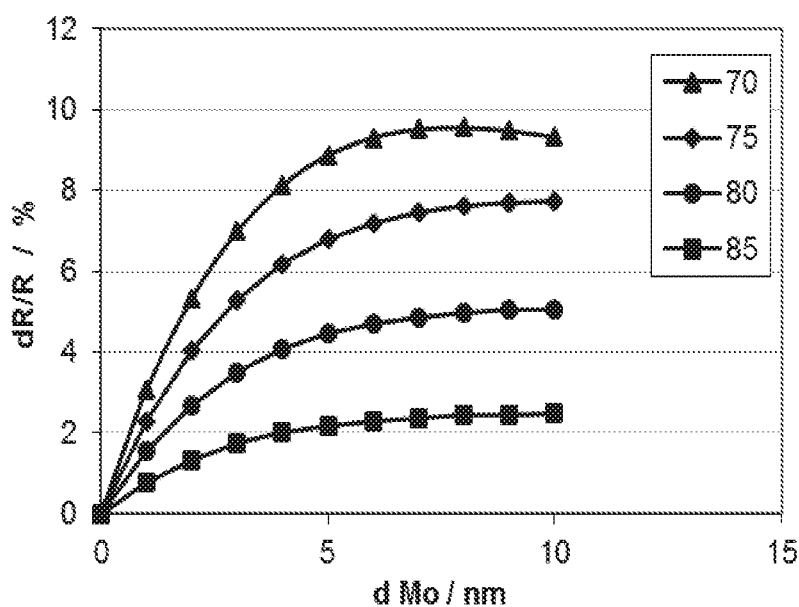
FIG. 10A shows the attainable reflectivity change as a function of the thickness of the amplifier layer versus angle of incidence and FIG. 10B shows the respective minimal reflectivity variation versus angle of incidence.
Figure 10B:
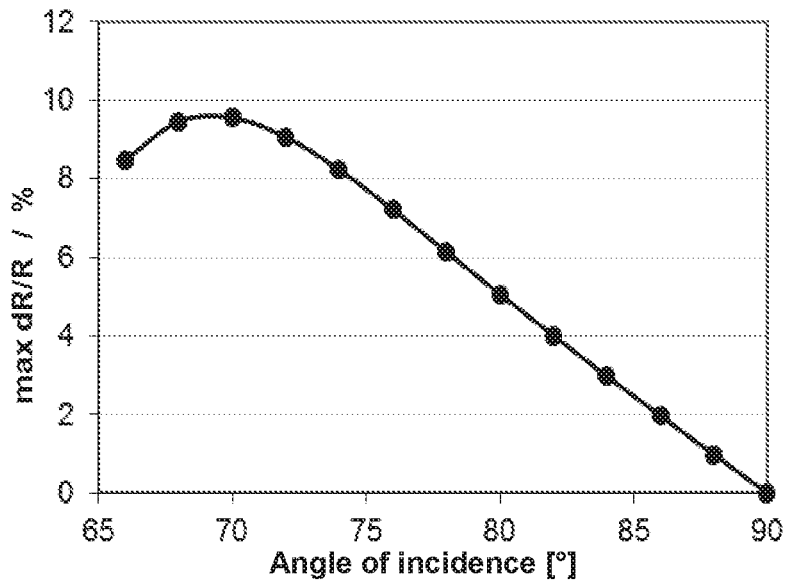

FIGS. 9A-9E show an illustrative embodiment in which, proceeding from a constant angle of incidence (indicated in FIG. 9A) across the optically effective surface of the mirror, it is desired in this example to set a linear profile of the reflectivity, in which case the thickness of the amplifier layer of molybdenum (Mo) is set as indicated in FIG. 9E. To explain further possible illustrative embodiments, FIGS. 10A-10B show the attainable reflectivity change as a function of the thickness of the amplifier layer (again produced from molybdenum (Mo)) for different angles of incidence (FIG. 10A) and the respective minimal reflectivity change as a function of the angle of incidence (FIG. 10B).

Figure 11A:
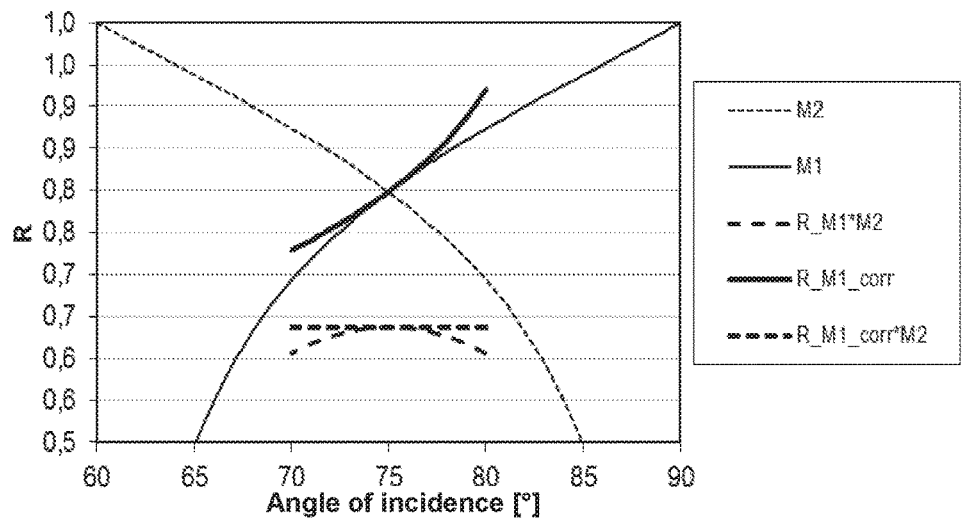
FIGS. 11A, 11B and 11C show profiles, for a further illustrative embodiment arranging two mirrors in succession, of angle of incidence versus reflectivity, reflectivity variation and amplifier layer thickness, respectively.
Figure 11B:
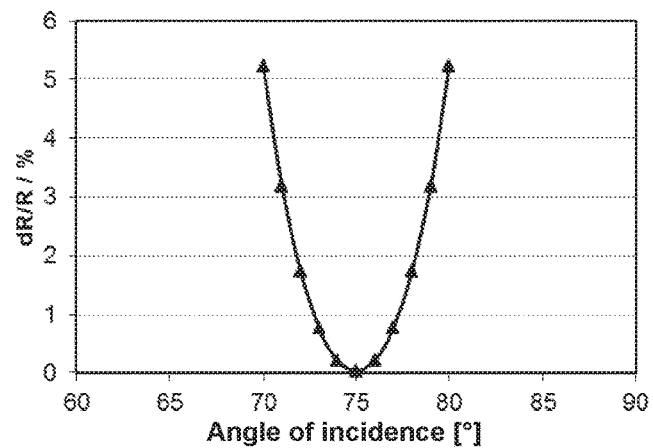

With reference to FIGS. 11A-11B, a further illustrative embodiment of the invention is now described in which (basically in a manner known per se) two mirrors are arranged in succession in the optical beam path in such a way that a beam impinging on the first of these mirrors with a comparatively large angle of incidence has a comparatively low angle of incidence on the second mirror, and vice versa.

In such an arrangement of two GI mirrors "disposed in series" in the optical beam path, the respective reflectivity profiles already partially compensate each other and to this extent only give a resulting intensity variation in so far as the two reflectivity profiles do not fully compensate each other, for example on account of an existing non-linearity of the respective profiles or on account of a more complex beam distribution in the optical system.

Figure 11C:
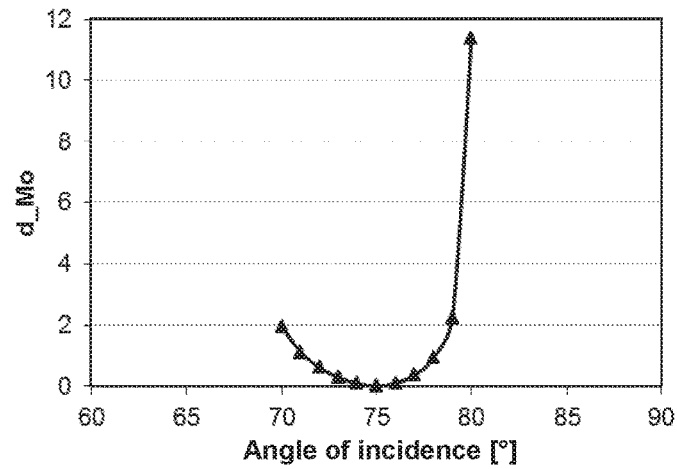

In order now to eliminate the remaining intensity variation (which in the example according to FIG. 11A is still strongest in the two edge areas of the spectrum of angle of incidence, i.e. at angles of incidence close to the value of 70° and angles of incidence close to the value of 80°), a compensation layer according to the invention, having a material and a thickness variation suitably chosen for the desired compensation, is applied to at least one of the two mirrors. FIG. 11B shows, analogously to the embodiments described above, an example of a profile of the reflectivity change required as a function of the angle of incidence for the compensation according to the invention, and FIG. 11C shows the required thickness of the amplifier layer for the respective angle of incidence.

In order to implement the invention in practice, an inhomogeneity present in a specific optical system and affecting the intensity distribution in a field plane and/or a pupil plane can initially be determined and then compensated via one or more compensation layers, having a suitable thickness gradient, on one or more GI mirrors, wherein the thickness of the respective compensation layer can vary in any suitable manner across the GI mirror in question.

Even though the invention has been described on the basis of specific embodiments, numerous variations and alternative embodiments are apparent to a person skilled in the art, e.g. by combination and/or exchange of features of individual embodiments. Accordingly, such variations and alternative embodiments are concomitantly encompassed by the present invention, and the scope of the invention is restricted only within the meaning of the accompanying patent claims and the equivalents thereof.

What is claimed is:

1. Optical system, comprising:
    (i) at least one first mirror which has an optically effective surface and, for electromagnetic radiation of a predefined operating wavelength impinging on the optically effective surface at an angle of incidence of at least 65° relative to a respective surface normal, has a reflectivity of at least 0.5, wherein the first mirror comprises:
        a reflection layer, and
        a compensation layer arranged above the reflection layer in a direction of the optically effective surface, the compensation layer having varying thickness; and
    (ii) at least one second mirror which, for the electromagnetic radiation of the predetermined operating wavelength impinging on the optically effective surface at an angle of incidence of at least 65° relative to the respective surface normal, has a reflectivity of at least 0.5,
        wherein, for a local variation of a reflectivity resulting from the first mirror and from the second mirror, which are arranged in succession in an optical beam path such that the first mirror directs the electromagnetic radiation of the predetermined operating wavelength onto an object plane of a projection lens, the at least one compensation layer, for an intensity distribution generated in a pupil plane or a field plane of the optical system during operation thereof, reduces a difference between the maximum and the minimum intensity value by at least 20% compared to an analogous system without the compensation layer.

2. Optical system according to claim 1, configured for a microlithographic projection exposure apparatus.

3. Optical system according to claim 1, wherein the compensation layer for the intensity distribution reduces the difference between the maximum and the minimum intensity value by at least 40% compared to an analogous mirror without the compensation layer.

4. Optical system according to claim 3, wherein the compensation layer for the intensity distribution reduces the difference between the maximum and the minimum intensity value by at least 80% compared to the analogous mirror without the compensation layer.

5. Optical system according to claim 1, wherein the reflection layer has a first material and the compensation layer has a second material, wherein the second material in a layer stack composed of the reflection layer and the compensation layer has, by comparison with the first material, a higher reflectance for electromagnetic radiation of a predefined operating wavelength impinging on the optically effective surface at an angle of incidence of at least 65° relative to the respective surface normal.

6. Optical system according to claim 5, wherein the compensation layer has, in a first sub-region, a material with lower absorption compared to the first material and, in a second sub-region, a material with higher absorption compared to the first material.

7. Optical system according to claim 1, wherein the reflection layer has a first material and the compensation layer has a second material, wherein the second material in a layer stack composed of the reflection layer and the compensation layer has, by comparison with the first material, a lower reflectance for electromagnetic radiation of a predefined operating wavelength impinging on the optically effective surface at an angle of incidence of at least 65° relative to the respective surface normal.

8. Optical system according to claim 1, wherein the reflection layer has at least one element from the group containing ruthenium (Ru), rhodium (Rh) and palladium (Pd).

9. Optical system according to claim 1, wherein the compensation layer has at least one element from the group containing molybdenum (Mo), niobium (Nb), zirconium (Zr), yttrium (Y), cerium (Ce), lanthanum (La), calcium (Ca), barium (Ba), strontium (Sr), titanium (Ti), beryllium (Be), boron (B), carbon (C), nitrogen (N), oxygen (O), silicon (Si) and fluorine (F).

10. Optical system according to claim 1, wherein the first mirror further comprises, between the substrate and the reflection layer, a substrate protection layer configured to protect the substrate from destructive action of the electromagnetic radiation.

11. Optical system according to claim 10, wherein the substrate protection layer has at least one material from the group containing iron (Fe), nickel (Ni), cobalt (Co), chromium (Cr), vanadium (V), copper (Cu), silver (Ag), gold (Au), platinum (Pt), iridium (Ir), ruthenium (Ru), palladium (Pd), rhodium (Rh), germanium (Ge), tungsten (Wo), molybdenum (Mo), tin (Sn), zinc (Zn), indium (In) and tellurium (Te).

12. Optical system according to claim 10, wherein the substrate protection layer is configured as a layer that reduces layer stress between the substrate and the reflection layer.

13. Optical system according to claim 1, wherein the first mirror further comprises a layer configured to reduce layer stress between the substrate and the reflection layer.

14. Optical system according to claim 13, wherein the layer configured to reduce layer stress has at least one material from the group containing iron (Fe), nickel (Ni), cobalt (Co), chromium (Cr), vanadium (V), copper (Cu), silver (Ag), gold (Au), platinum (Pt), iridium (Ir), ruthenium (Ru), palladium (Pd), rhodium (Rh), germanium (Ge), tungsten (Wo), molybdenum (Mo), tin (Sn), zinc (Zn), indium (In) and tellurium (Te).

15. Optical system according to claim 1, wherein at least one of the layers is configured as a multi-layer system.

16. Optical system according to claim 1, wherein the operating wavelength is less than 30 nm.

17. Optical system according to claim 16, wherein the operating wavelength is in a range of 10 nm to 15 nm.

18. Microlithographic projection exposure apparatus, comprising an illumination device and a projection lens, wherein the illumination device, during operation of the projection exposure apparatus, illuminates a mask situated in an object plane of the projection lens, and the projection lens images structures on the mask onto a light-sensitive layer situated in an image plane of the projection lens, wherein the projection exposure apparatus has at least one optical system according to claim 1.

19. Optical system according to claim 1, wherein the electromagnetic radiation of the operating wavelength impinges on the first mirror with a large angle of incidence in comparison to the second mirror or wherein the electromagnetic radiation of the operating wavelength impinges on the second mirror with a large angle of incidence in comparison to the first mirror.

20. Optical system according to claim 1, wherein the compensation layer comprises an attenuation layer in at least two first areas of the first mirror with a high angle of incidence and comprises an amplifier layer in at least two second areas of the first mirror having a low angle of incidence and wherein the attenuation layer is a molybdenum only layer and the amplifier layer is a molybdenum dioxide layer.

21. Optical system according to claim 1, wherein the first mirror has a first reflectivity profile and the second mirror has a second reflectivity profile which partially compensates the first reflectivity profile of the first mirror resulting only in the local variation of the reflectivity.

\* \* \* \* \*

UNITED STATES PATENT AND TRADEMARK OFFICE
CERTIFICATE OF CORRECTION

Page 1 of 1

PATENT NO. : 10,520,827 B2
APPLICATION NO. : 16/241462
DATED : December 31, 2019
INVENTOR(S) : Hartmut Enkisch et al.

It is certified that error appears in the above-identified patent and that said Letters Patent is hereby corrected as shown below:

In the Specification

Column 7, Line 62, Delete "FIG." and insert -- FIGS. --, therefor.

Signed and Sealed this
Twenty-seventh Day of October, 2020

Andrei Iancu
*Director of the United States Patent and Trademark Office*